United States Patent
Hoang et al.

(10) Patent No.: US 7,167,373 B1
(45) Date of Patent: Jan. 23, 2007

(54) STACKING MULTIPLE DEVICES USING FLEXIBLE CIRCUIT

(75) Inventors: Phan Hoang, Mission Viejo, CA (US); Chinh Nguyen, Irvine, CA (US); Frank Hoang, Foothill Ranch, CA (US); Andy Le, Garden Grove, CA (US)

(73) Assignee: Virtium Technology, Inc., Rancho Santa Margarita, CA (US)

( * ) Notice: Subject to any disclaimer, the term of this patent is extended or adjusted under 35 U.S.C. 154(b) by 317 days.

(21) Appl. No.: 10/796,540

(22) Filed: Mar. 8, 2004

(51) Int. Cl.
*H05K 7/06* (2006.01)

(52) U.S. Cl. ............ 361/749; 361/803; 174/254; 257/686; 29/840; 438/109

(58) Field of Classification Search ............ None
See application file for complete search history.

(56) References Cited

U.S. PATENT DOCUMENTS

| | | | | |
|---|---|---|---|---|
| 5,345,205 A | * | 9/1994 | Kornrumpf | 333/246 |
| 6,121,676 A | * | 9/2000 | Solberg | 257/686 |
| 6,225,688 B1 | * | 5/2001 | Kim et al. | 257/686 |
| 6,717,250 B1 | * | 4/2004 | Emoto | 257/686 |
| 7,071,547 B1 | * | 7/2006 | Kang et al. | 257/686 |

* cited by examiner

*Primary Examiner*—John B. Vigushin
(74) *Attorney, Agent, or Firm*—Blakely, Sokoloff, Taylor & Zafman

(57) ABSTRACT

One embodiment of the invention includes a flexible circuit and a stiffener. The flexible circuit has first, second, and third portions. The first portion is folded on an upper surface of the third portion and has first contact elements attached to a first device. The second portion is folded on the first device and has second contact elements attached to a second device. The stiffener is attached to the upper surface of the third portion and located between the upper surface of the third portion and the first portion.

27 Claims, 6 Drawing Sheets

STACKING MULTIPLE DEVICES USING FLEXIBLE CIRCUIT

BACKGROUND

1. Field of the Invention

This invention relates to packaging. In particular, the invention relates to stacking integrated circuit (IC) devices.

2. Description of Related Art

Demands for high density boards in microprocessor systems have created many challenges to the board assembly process. Among several methods, stacking multiple integrated circuit (IC) devices saves a significant amount of space on printed circuit board (PCB).

The next generation memory modules run at very high frequencies such as the Double Data Rate 2 (DDR2) dynamic random access memory (DRAM). The operating frequencies may range from 133 MHz to 1 GHz or higher. The packaging of these devices needs to be changed to more advanced packaging techniques such as Ball Grid Array (BGA) to maintain performance characteristics. Existing techniques to stack multiple devices in other chip packages are not applicable to the BGA packaging. Furthermore, even for other chip packages, existing techniques have a number of disadvantages such as mechanical weakness, low signal integrity, high manufacturing costs, etc.

Therefore, there is a need to have an efficient technique to stack multiple IC devices.

BRIEF DESCRIPTION OF THE DRAWINGS

The features and advantages of the present invention will become apparent from the following detailed description of the present invention in which.

DESCRIPTION OF THE INVENTION

The present invention is a technique for stacking multiple integrated circuit (IC) devices. One embodiment of the invention includes a flexible circuit and a stiffener. The flexible circuit has first, second, and third portions. The first portion is folded on an upper surface of the third portion and has first contact elements attached to a first device. The second portion is folded on the first device and has second contact elements attached to a second device. The stiffener is attached to the upper surface of the third portion and located between the upper surface of the third portion and the first portion.

In the following description, for purposes of explanation, numerous details are set forth in order to provide a thorough understanding of the present invention. However, it will be apparent to one skilled in the art that these specific details are not required in order to practice the present invention. In other instances, well-known structures are shown in block diagram form in order not to obscure the present invention.

Figure 1:
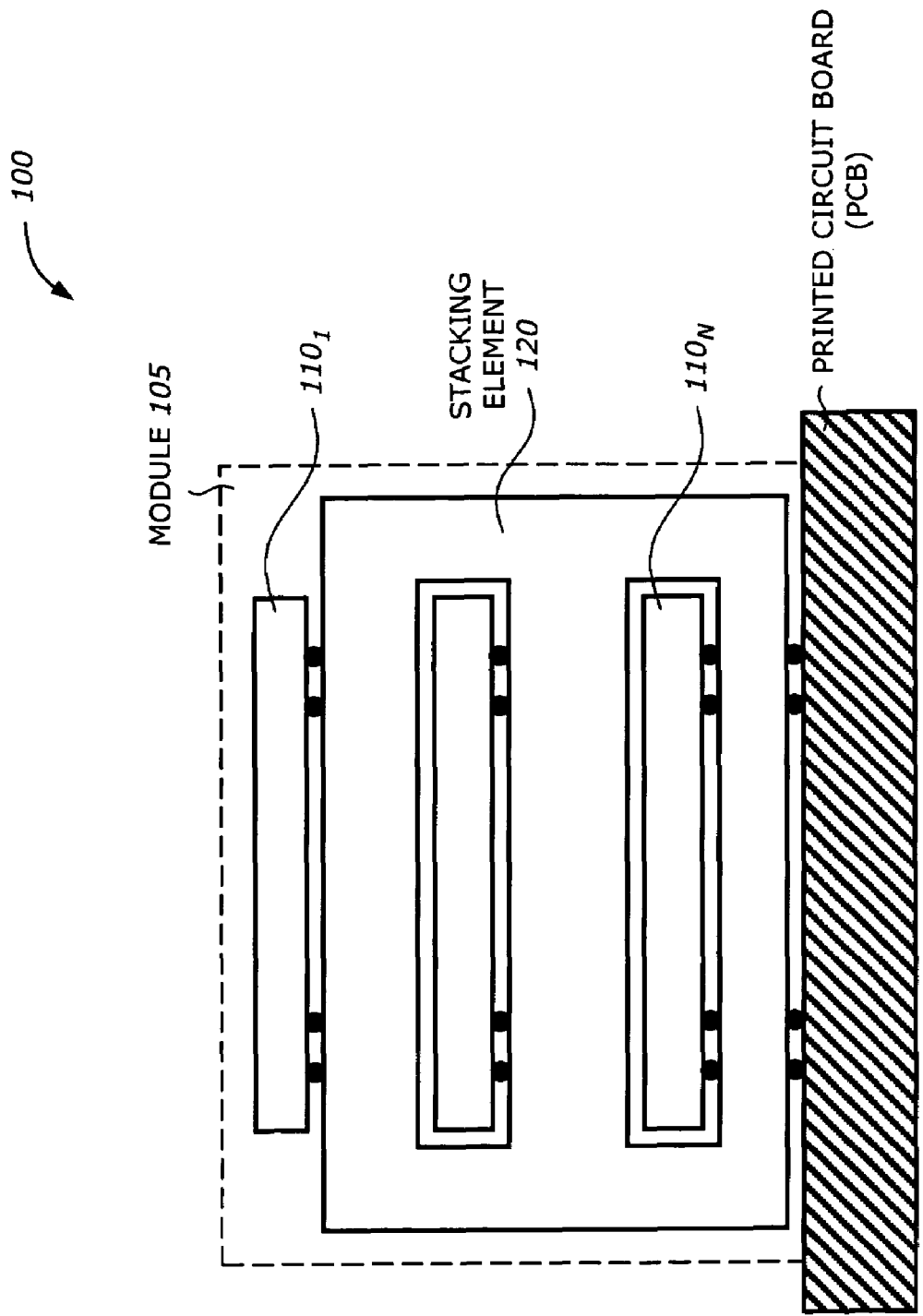
FIG. 1 is a diagram illustrating a module of multiple stacked IC devices in which one embodiment of the invention can be practiced.

FIG. 1 is a diagram illustrating a system 100 in which one embodiment of the invention can be practiced. The system 100 includes a module 105 and a printed circuit board (PCB) 130.

The module 105 includes N IC devices $110_I$ to $110_N$ and a stacking elements 120 where N is a positive integer number. The N IC devices $110_I$ to $110_N$ are stacked one on top of another in a vertical direction. As is known by one skilled in the art, the actual orientation of the module 105 may be in any suitable direction including vertical, horizontal, or angular. The stacked IC devices $110_I$ to $110_N$ provide a significant board spacing by having the same footprint as one IC device on the PCB 130. The module 105 is rigid and has stable mechanical structure. The N stacked IC devices $110_I$ to $110_N$ are any IC devices such as memory devices, buffers, logic circuits, processors, etc. In one embodiment, the N IC devices $110_I$ to $110_N$ are identical or like devices with similar pin-out and packaging. In particular, memory devices such as dynamic random access memory (DRAM), static random access memory (SRAM), flash memory, read only memory, electrically erasable read only memory (EE-ROM) are suited for this application. In one embodiment, the devices are Double Data Rate (DDR), DDR 2 synchronous DRAM with operating frequency range of over 400 MHz. The N IC devices $110_I$ to $110_N$ have the same packaging. The packaging may be any suitable packaging such as surface mount devices (SMD) J-lead chip carrier (JLCC), gull-wing lead, thin quad flat pack (TQFP), plastic quad flat pack (PQFP), thin small outline package (TSOP), shrink thin small outline package (STSOP), Ball Grid Array (BGA), micro BGA (µBGA).

The stacking element 120 provides mechanical support and electrical interconnections to stack the N IC devices $110_I$ to $110_N$. Circuit lay-out in the stacking element 120 provides suitable connections of the signals of the N IC devices $110_I$ to $110_N$ such as no-connection, address lines, data lines, command lines, chip enable, etc.

The PCB 130 contains other elements or devices including the module 105. The PCB 130 may also contain signal traces that correspond to the pins of the N IC devices 110 and $110_N$. The lower surface of the stacking element 120 has solder pads to be soldered on the PCB 130. Therefore, with respect to the surface of the PCB 130, the IC devices 110 to $110_N$ are stacked in the vertical direction. Note that the reference to the PCB 130 is merely for illustrative purposes. The module 105 may be placed on any board at any orientation, and on any other devices.

Figure 2:
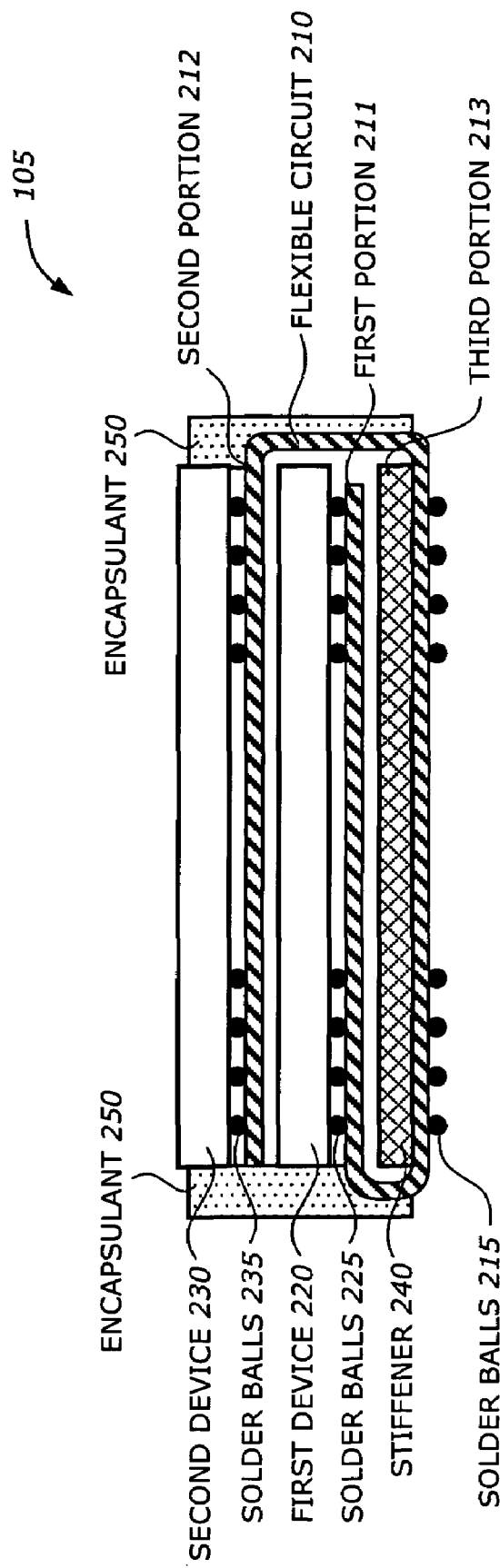
FIG. 2 is a diagram illustrating a module with two stacked devices according to one embodiment of the invention.

FIG. 2 is a diagram illustrating a module 105 with two stacked devices according to one embodiment of the invention. The module 105 includes a flexible circuit 210, first and second devices 220 and 230, a stiffener 240, and an encapsulant 250.

The flexible circuit 210 is made of a flexible material. It can be folded or bent to provide mechanical support and electrical connections to IC devices that are attached to the folded portions of the flexible circuit 210. The flexible circuit 210 includes a first portion 211, a second portion 212, and a third portion 213. The third portion 213 is at the bottom of the module 105 and is interfaced or attached to the PCB 130 via contact elements or solder pads or balls 215 on its lower surface. The first portion 211 is folded to be on top of the third portion 213. It has contact elements or solder pads to be soldered or attached to the first device via solder balls 225. The second portion 212 is folded on top of the first device 220. It has contact elements or solder pads to be soldered or attached to the second device 230 via solder balls 235. The flexible circuit 210 has a width to be approximately the same as the length of first and second devices, and a length to be approximately to be three times the width of the first and second devices with some extra area to accommodate the folding margin.

The stiffener 240 is attached to the upper surface of the third portion 213. It may be pasted on the upper surface by an adhesive. The stiffener 240 has dimensions to be approximately the same as the first or second device. It is located between the third portion 213 and the first portion 211. It is used to provide additional mechanical strength to the flexible circuit 210. It helps straighten the surface of the third portion 213 and increase rigidity to the module 105. The stiffener 240 may be made by a suitable material. It may be a polyimide film, a mica plate, a polyester film, a polyaramid paper, a FR4 material, or copper.

The encapsulant 250 encapsulates the module 105 to bond the first and second devices 220 and 230. The encapsulant 250 keeps the first and second devices to be held together with the flexible circuit 210. It is made of a material that has high resistance to temperature and mechanical stress, and moisture, and other adverse environmental conditions. In one embodiment, the encapsulant 250 is made of adhesive material such as epoxy, polyimide, etc. The encapsulant 250 may be pasted on the sides of first and second devices 220 and 230 and the flexible circuit 210. This include the horizontal and the vertical sides of the first and second devices 220 and 230.

Figure 3:
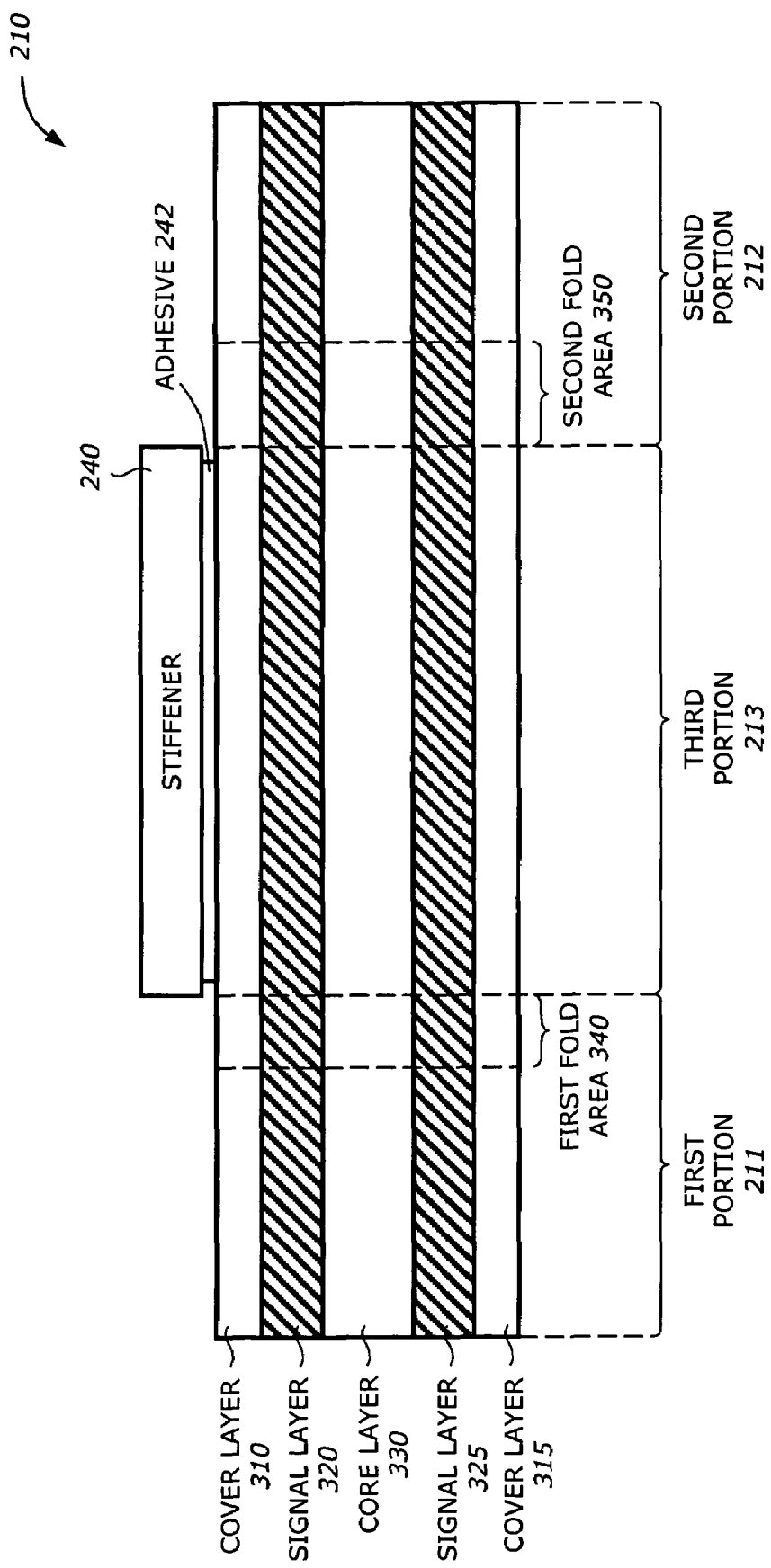
FIG. 3 is a diagram illustrating an unfolded flexible circuit according to one embodiment of the invention.

FIG. 3 is a diagram illustrating an unfolded flexible circuit 210 according to one embodiment of the invention. The flexible circuit 210 includes coverlays 310 and 315, signal layers 320 and 325, and a core layer 330.

The coverlays 310 and 315 are the top and bottom layers of the flexible circuit 210, respectively. They are typically made of adhesive polyimide or equivalent material. In one embodiment, these layers have a thickness of approximately 0.0005" each. The signal layers 320 and 325 are typically made of copper or a suitable conductive material. They have signal traces that map to the solder pads of the first and second devices 220 and 230. The signal traces on these layers provide electrical connections so that corresponding signals are connected together. In one embodiment, these layers have a thickness of approximately 0.007" each.

The core layer 330 may have additional adhesive layers and a dielectric layer. The dielectric layer may be made of a suitable dielectric material such as polyimide. The coefficient of thermal expansion of the core layer may range from 3 to 20 ppm/° C. Examples of the material for the core layer include Kaptone® by Dupont, Upilexe® S by Ube Industries, and P1 2611® by HD Microsystems. In one embodiment, the thickness of the core layer is approximately 0.001".

The first portion 211 of the flexible circuit 211 includes a first fold area 340. The first fold area 340 provides the folding margin to fit the thickness of the stiffener 240 to allow sufficient tolerance when it is folded or bent on the stiffener 240. Similarly, the second portion 212 has a second fold area 350 to fit the total thicknesses of the stiffener 240, the first portion 211, and the first device 220 when it is folded on the first device 211.

The third portion 213 has adhesive 242 to attach to the stiffener 240. As discussed above, the stiffener 240 provides mechanical rigidity to the third portion when the first portion 211 and the second portion 212 are folded. This mechanical rigidity maintains the accuracy of the land pattern of the solder pads on the lower surface of the third portion 213.

Figure 4:
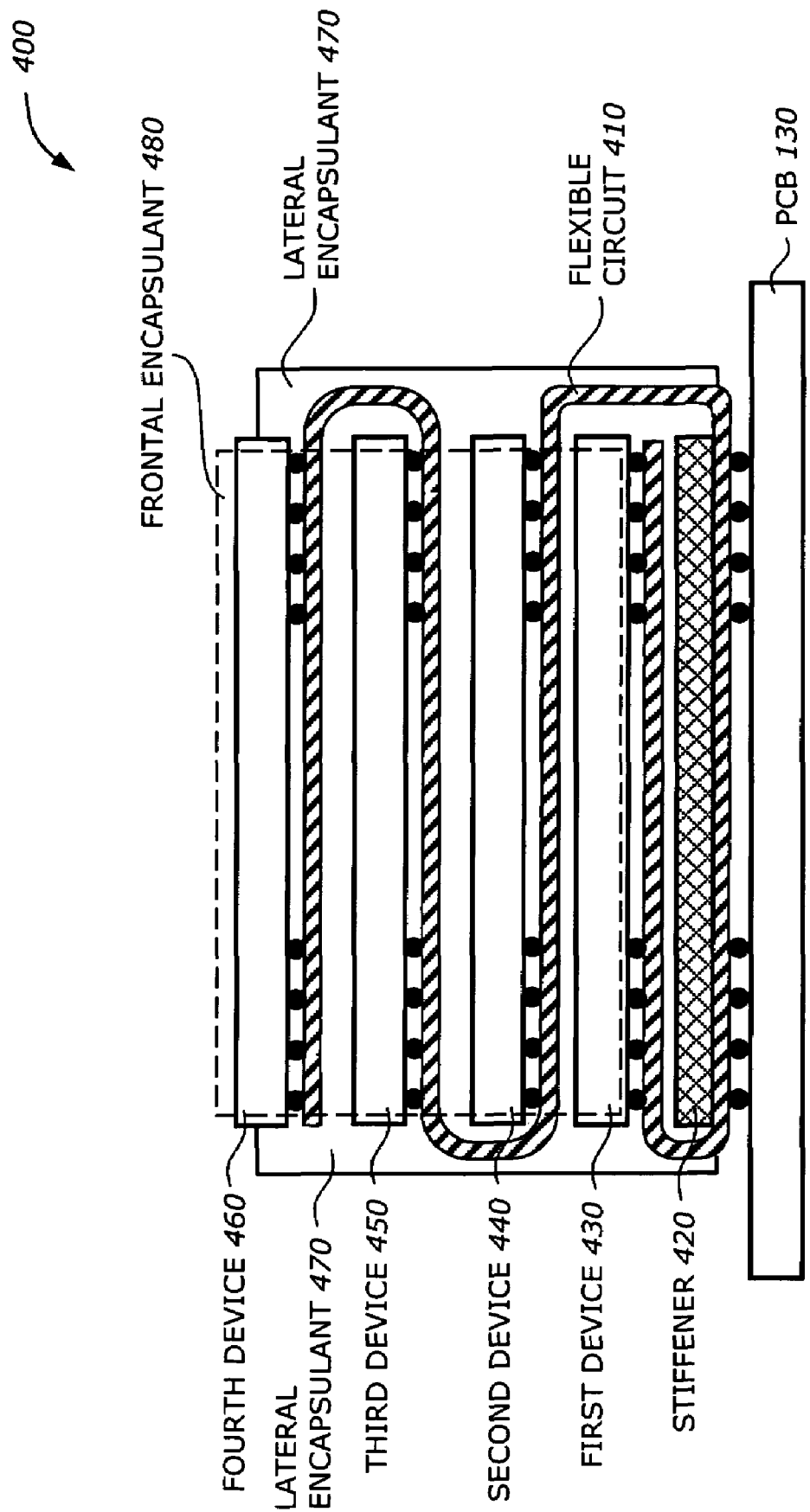
FIG. 4 is a diagram illustrating a module with more than two stacked devices according to one embodiment of the invention.

FIG. 4 is a diagram illustrating a module 400 with more than two stacked devices according to one embodiment of the invention. The module 400 includes a flexible circuit 410, a stiffener 420, and first, second, third, and fourth devices 430, 440, 450, and 460, respectively. Note that the use of 4 devices is only for illustrative purposes. The module 400 may accommodate 3, or more than 4 devices.

The flexible circuit 410 is similar to the flexible circuit 210 shown in FIG. 2 except that its length is extended to accommodate four devices instead of two. In general, for N devices, the flexible circuit 410 includes N+1 portions. The bottom portion has solder pads at the lower surface to be attached to the PCB 130. The stiffener 420 is similar to the stiffener 240 shown in FIG. 2. Each of the other portions of the flexible circuit 410 has solder pads or contact elements that are mapped to correspond to the solder balls of the device that is attached to it.

The encapsulant may be pasted on sides of the devices and the flexible circuit. For example, it may be pasted on the lateral sides as shown by the lateral encapsulant 470 to bond the third and fourth devices 450 and 460, or it may be pasted on the frontal sides as shown by the frontal encapsulant 480 to bond all four devices together. It may be also pasted on the back sides of the four devices. The pasting is such that the encapsulant serves to hold the devices and the flexible circuit together firmly.

Figure 5:
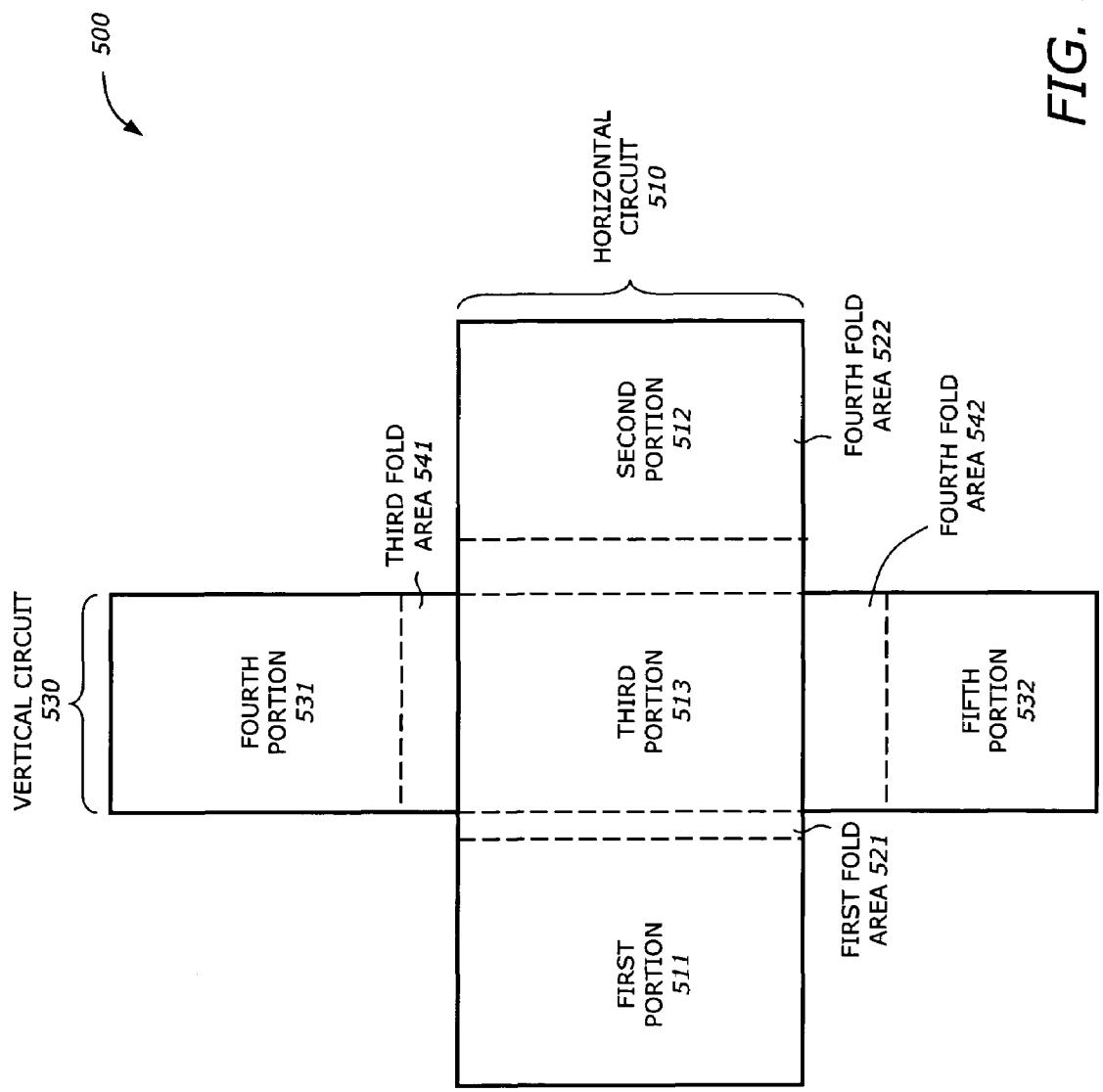
FIG. 5 is a diagram illustrating a flexible circuit with 4 folding directions according to one embodiment of the invention.

FIG. 5 is a diagram illustrating a flexible circuit with 4 folding directions according to one embodiment of the invention. The flexible circuit 500 includes a horizontal circuit 510 and a vertical circuit 530.

The horizontal circuit 510 is similar to the flexible circuit 210 shown in FIG. 2. It is arranged to be folded in the horizontal direction. It has first, second, and third portions 511, 512, and 513. The vertical circuit 530 is arranged to be folded in the vertical direction. It has fourth and fifth portions 531 and 531. Note that the terms "horizontal" and "vertical" are used merely to designate the relative direction of the folding, not necessarily the absolute direction.

The folding of the flexible circuit 500 follows an order as follows. First, a stiffener is attached to the third portion 513. Then, the first portion 511 is folded on the stiffener. The first portion 511 has a first fold area 521 to fit the thickness of the stiffener. The first portion has contact elements to be attached to a first device. Next, the second portion 512 is folded on the first device. The second portion 512 has contact elements to be attached to a second device. It has a second fold area 522 to fit the total thickness of the stiffener, the first portion 511, and the first device.

Then, the fourth portion 531 is folded on the second device. It has contact elements to be attached to a third device. It also has a third fold area 541 to fit the total thickness of the thickness accommodated by the second fold area 522 and the thickness of the second portion 512 and the second device. Next, the fifth portion 532 is folded on the third device. It has contact elements to be attached to a fourth device. It has a fourth fold area 542 to fit the total thickness of the thickness accommodated by the third fold area 541 and the third device.

The flexible circuit 500 may also be cut or shaped in other variations. For example, the fourth and fifth portions 531 and 532 may be attached to both sides of the second portion 512 instead of the third portion 513. Such an arrangement helps reducing the size of the third fold area 541 and the fourth fold area 542.

For this arrangement, there may be more than one level of encapsulating. The inner level uses an encapsulant pasted to the first and second devices before folding the fourth and fifth portions. The outer level uses an encapsulant pasted to the third and fourth devices.

Figure 6:
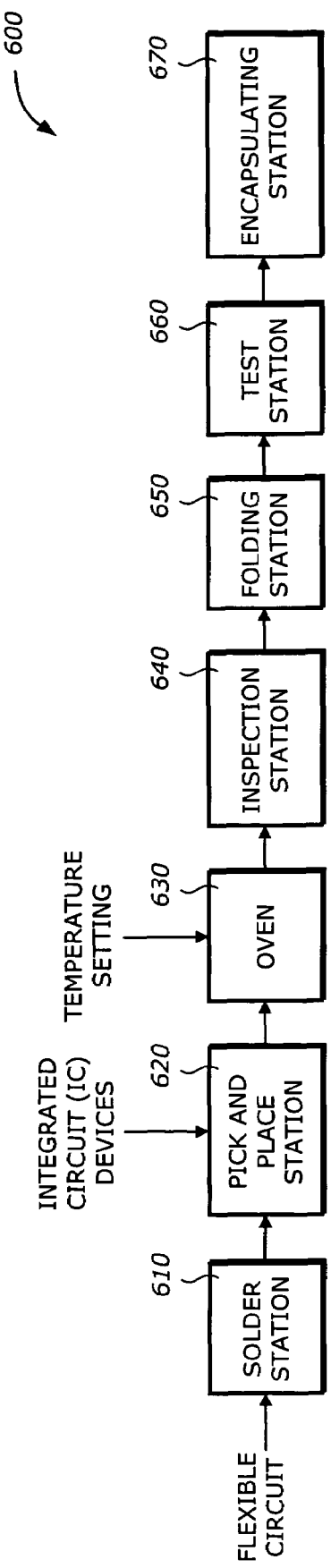
FIG. 6 is a diagram illustrating a process to manufacture modules with flexible circuits according to one embodiment of the invention.

FIG. 6 is a diagram illustrating a process to manufacture modules with flexible circuits according to one embodiment of the invention. The manufacturing process may include a number of stations. The sequence of these stations may be re-arranged or in any suitable order. The following is an illustrative sequence.

First, the flexible circuit goes to a solder station 610 so that solder balls are soldered onto the bottom of the portion of the flexible circuit that is to be attached to the PCB. Then, the flexible circuit is populated at a pick and place station 620 with the IC devices on appropriate sides and portions.

Then, the entire flexible circuit and the attached devices are cured and treated in an oven 630 to dry out the solder bumps. The oven 630 has a suitable temperature setting and a timer. In one embodiment, the temperature used in the oven 630 is approximately 185° C. to 215° C. and the cure time or heating time is approximately 5 minutes.

After heat treatment in the oven 630 the flexible circuit and the attached devices go to an inspection station 640. The inspection may be manual or automatic to ensure that the flexible circuit is properly folded and the soldering joints are properly formed. Defects such as bridging, shorts, opens, and solder voids can be detected. Other assembly conditions such as component placement, device identification, and orientation are also inspected as appropriate. Then the flexible circuit and the attached devices go to a folding station 650. At the folding station 650, the flexible circuit is folded accordingly as illustrated above. The folding may be manual or automatic. After folding, the folded assembly goes to a test station 660. At the test station 660, various electrical and mechanical tests are performed to ensure the functionalities. Then, the assembly goes to encapsulating station 670. At the encapsulating station 670, the encapsulant is pasted or applied to the folded assembly. Additional curing may be applied.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
a flexible circuit having first, second, and third portions, the first portion being folded on an upper surface of the third portion and having first contact elements attached to a first device, the second portion being folded on the first device and having second contact elements attached to a second device, wherein at least one of the first and second contact elements comprise a plurality of solder pads; and
a stiffener attached to the upper surface of the third portion and located between the upper surface of the third portion and the first portion.

2. The apparatus of claim 1 further comprising:
an encapsulant to encapsulate the flexible circuit and the first and second devices.

3. The apparatus of claim 1 wherein the third portion has a lower surface having third contact elements.

4. The apparatus of claim 3 wherein the lower surface is attached to at least one of a printed circuit board and a third device via the third contact elements.

5. The apparatus of claim 4 wherein the first, second, and third portions include first, second, and third layer having signal traces mapped to the first, second, and third contact elements, respectively.

6. The apparatus of claim 3 wherein the third contact elements comprise a plurality or solder pads.

7. The apparatus of claim 3 wherein the stiffener is made of one of an insulating material, a polyimide film, a mica plate, a polyester film, and a polyaramid paper.

8. The apparatus of claim 1 wherein the first and second devices are identical devices having solder balls attached to the first and second contact elements, respectively.

9. The apparatus of claim 8 wherein the identical devices are memory devices.

10. A method comprising:
folding a flexible circuit having first, second, and third portions, the first portion being folded on an upper surface of the third portion and having first contact elements attached to a first device, the second portion being folded on the first device and having second contact elements attached to a second device, wherein at least one of the first and second contact elements comprise a plurality of solder pads; and
attaching a stiffener to the upper surface of the third portion and between the upper surface of the third portion and the first portion.

11. The method of claim 10 further comprising:
encapsulating the flexible circuit and the first and second devices by an encapsulant.

12. The method of claim 10 wherein the third portion has a lower surface having third contact elements.

13. The method of claim 12 further comprising attaching the lower surface to at least one of a printed circuit board and a third device via the third contact elements.

14. The method of claim 13 wherein the first, second, and third portions include first, second, and third layer having signal traces mapped to the first, second, and third contact elements, respectively.

15. The method of claim 12 wherein the third contact elements comprise a plurality of solder pads.

16. The method of claim 10 wherein the first and second devices are identical devices having solder balls attached to the first and second contact elements, respectively.

17. The method of claim 16 wherein the identical devices are memory devices.

18. The method of claim 10 wherein the stiffener is made of one of an insulating material, a polyimide film, a mica plate, a polyester film, and a polyaramid paper.

19. A module comprising:
a first device and a second device; and
a stacking element to stack the second device on the first device, the stacking element comprising:
a flexible circuit having first, second, and third portions, the first portion being folded on an upper surface of the third poition and having first contact elements attached to the first device, the second portion being folded on the first device and having second contact elements attached to the second device, wherein at least one of the first and second contact elements comprise a plurality of solder pads; and
a stiffener attached to the upper surface of the third portion and located between the upper surface of the third portion and the first portion.

20. The module of claim 19 wherein the stacking element further comprising:
an encapsulant to encapsulate the flexible circuit and the first and second devices.

21. The module of claim 19 wherein the third portion has a lower surface having third contact elements.

22. The module of claim 21 wherein the lower surface is attached to at least one of a printed circuit board and a third device via the third contact elements.

23. The module of claim 22 wherein the first, second, and third portions include first, second, and third layer having signal traces mapped to the first, second, and third contact elements, respectively.

24. The module of claim 21 wherein the third contact elements comprise a plurality of solder pads.

25. The module of claim 19 wherein the first and second devices are identical devices having solder balls attached to the first and second contact elements, respectively.

26. The module of claim 25 wherein the identical devices are memory devices.

27. The module of claim 25 wherein the stiffener is made of one of an insulating material, a polyimide film, a mica plate, a polyester film, and a polyaramid paper.

* * * * *